(12) United States Patent
Tseng

(10) Patent No.: US 6,395,603 B1
(45) Date of Patent: May 28, 2002

(54) METHOD OF FORMING A TUNNEL OXIDE LAYER OF A NON-VOLATILE MEMORY CELL

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/745,334

(22) Filed: Dec. 20, 2000

(51) Int. Cl.[7] ............... H01L 21/3105; H01L 21/335
(52) U.S. Cl. ............... 438/260; 438/264; 438/770; 438/964
(58) Field of Search ............... 438/260, 264, 438/770, 964, FOR 488, FOR 189, FOR 203, FOR 212, FOR 399; 148/DIG. 138

(56) References Cited

U.S. PATENT DOCUMENTS

| | | | | |
|---|---|---|---|---|
| 5,650,351 A | * | 7/1997 | Wu | 438/398 |
| 5,970,342 A | * | 10/1999 | Wu | 438/260 |
| 6,043,124 A | * | 3/2000 | Wu | 257/309 |
| 6,117,731 A | * | 9/2000 | Wu | 438/257 |
| 6,127,698 A | * | 10/2000 | Wu | 257/30 |
| 6,148,087 A | * | 11/2000 | Martin | 381/23.1 |
| 6,222,722 B1 | * | 9/2001 | Fukuzumi et al. | 257/308 |
| 2001/0023110 A1 | * | 3/2001 | Fukuzumi et al. | 438/396 |

* cited by examiner

*Primary Examiner*—George Fourson
(74) *Attorney, Agent, or Firm*—Blakely Sokoloff Taylor & Zafman, LLP

(57) ABSTRACT

A method of forming a tunnel oxide layer of a non-volatile memory cell is disclosed. First, a first dielectric layer and a second dielectric layer are formed on a semiconductor substrate. After patterning the second dielectric layer to form an opening, the semiconductor substrate is oxidized to form a non-tunnel oxide within the opening. After removing the second dielectric layer, source/drain regions are formed by performing an ion implantation process and an annealing process. After removing the first dielectric layer, an HSG layer with a plurality of HSG grains are formed on the source/drain regions. After that, the HSG layer is partially etched by HF vapor to enlarge a spacing between the HSG grains. Finally, the HSG layer is oxidized to form the tunnel oxide layer.

20 Claims, 5 Drawing Sheets

METHOD OF FORMING A TUNNEL OXIDE LAYER OF A NON-VOLATILE MEMORY CELL

BACKGROUND OF THE INVENTION (1) Field of the Invention

The present invention relates generally to a method of manufacturing an oxide layer, and more particularly, to a method of forming a tunnel oxide layer of a non-volatile memory cell.

(2) Description of the Related Art

Integrated circuits (ICs), such as ultra-large scale integrated (ULSI) circuits, can include as many as one billion transistors or more. The ULSI circuits are generally composed of complementary metal oxide semiconductor field effect transistors (MOSFETs). For a typical random access memory (RAM), the data stored in the memory is volatile. For this reason, a power supply is needed to refresh the data stored in the memory.

On the other hand, non-volatile memories such as Read-only-memories (ROMs), electrically erasable programmable ROM (EEPEOM) or flash memories, are memories into which information is permanently stored.

In order to fabricate a low power non-volatile memory with textured tunnel oxide with high electron injection efficiency and a large charge-to-breakdown, a method for forming high-density non-volatile memories with high capacitive-coupling radio was disclosed in U.S. Pat. No. 6,043,124. According to this prior art, referring first to FIG. 1A, a silicon oxide layer 4 and a thick silicon nitride layer 6 are deposited on a substrate 2. The field oxide (FOX) pattern is now defined by using a conventional photolithography process, and then a dry etching process is performed to etch the thick silicon nitride layer 6 and the pad oxide layer 4. After striping the photoresist, a thermal oxidation process is performed, and the thick field oxide regions 8 are grown to a thickness between 3000 to 8000 angstroms. Thereafter, the silicon nitride layer 6 is optionally removed, and a new silicon nitride layer 10 is created over the substrate 2. After that, another photolithography process is performed to define the tunnel oxide region. An etching process is performed to selectively etch the silicon nitride layer 10 but not the pad oxide layer 4 and expose a portion of the pad oxide layer 4. A thermal oxidation process is then performed to grow a thick thermal oxide 12 on the non-tunnel region, as shown in FIG. 1A.

Referring now to FIG. 1B, the masking silicon nitride film 10 is removed by a wet etching with hot phosphoric acid. An ion implantation process is performed to implant appropriate impurity ions through the silicon oxide layer 4, but not the thick oxide 12, into the substrate 2 to form the source and drain 14. The substrate 2 is then thermal annealed to recover the implantation damage by a preferable method as rapid thermal processing (RTP) process. The dopants are activated and driven in to form the best distribution profile at this step, as shown in FIG. 1B. Thereafter, the silicon oxide 4 is removed by performing a wet etching process. Next, an ultra-thin undoped amorphous silicon (a-Si) film 16 is deposited on the substrate 2. A thermal process is performed to crystallize the a-Si film 16 into polysilicon.

Referring now to FIG. 1C, a thermal oxidation process is performed to form a textured tunnel oxide. Next, a conductive layer 20 is deposited on the substrate 2. A traditional photolithography process is performed to define the floating gate pattern. An anisotropic etching is then performed to etch the conductive layer, so that the floating gate 20 is formed on the active region and a portion of the field oxide region. An ultra-thin interpoly dielectric (IPD) layer 22 is deposited on the surface of the floating gate 20. Finally, another conductive layer is formed on the interpoly dielectric layer 22 to serve as the control gate 24.

The disadvantage of the prior art is that the a-Si film 16 or the HSG layer used in the prior art is not conformal. As a result, the subsequent textured tunnel oxide is not conformal and not uniform in thickness. For this reason, the electron-injection efficiency and charge-to-breakdown of the tunnel oxide layer according to the prior art are not stable and not reliable.

SUMMARY OF THE INVENTION

Accordingly, it is a primary object of the present invention to a method of forming a tunnel oxide layer of a non-volatile memory cell.

It is another object of the present invention to provide a non-volatile memory cell with a conformal tunnel oxide layer.

A method of forming a tunnel oxide layer of a non-volatile memory cell is disclosed. First, a first dielectric layer and a second dielectric layer are formed on a semiconductor substrate. After patterning the second dielectric layer to form an opening, the semiconductor substrate is oxidized to form a non-tunnel oxide within the opening. After removing the second dielectric layer, source/drain regions are formed by performing an ion implantation process and an annealing process. After removing the first dielectric layer, an HSG layer with a plurality of HSG grains are formed on the source/drain regions. After that, the HSG layer is partially etched by HF vapor to enlarge a spacing between the HSG grains. In addition to HF vapor, a plasma etching process by fluorine-based gas plasma such as $SF_6$, $CF_4$, and $NF_3$ can achieve the same purpose.

Next, the HSG layer is oxidized to form the tunnel oxide layer. A floating gate of the non-volatile memory cell is formed on the tunnel oxide layer. After forming an interpoly dielectric of the non-volatile memory cell on the floating gate, a control gate of the non-volatile memory cell is deposited on the interpoly dielectric.

The key feature of the present invention is that the tunnel oxide layer is conformal and having uniform thickness. For this reason, the electron-injection efficiency and charge-to-breakdown of the tunnel oxide layer are more stable and can be well-controlled. The non-volatile memory cell according to the present invention is more reliable by means of the conformal tunnel oxide layer.

BRIEF DESCRIPTION OF THE DRAWINGS

The accompanying drawings forming a material part of this description, in which.

DESCRIPTION OF THE PREFERRED EMBODIMENTS

The present invention relates generally to a method of manufacturing an oxide layer, and more particularly, to a method of forming a tunnel oxide layer of a non-volatile memory cell.

Figure 1A:
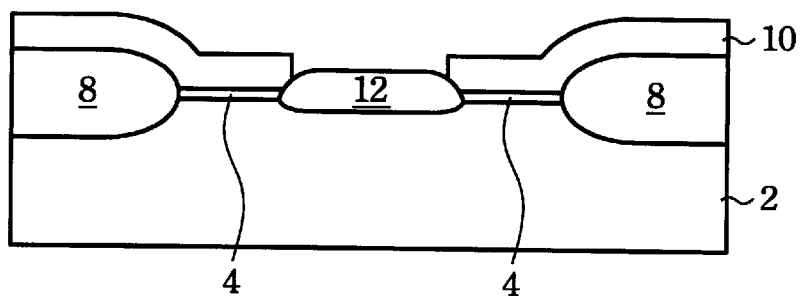
FIG. 1A to FIG. 1C schematically illustrate the cross-sectional diagram of the method of forming a tunnel oxide layer of a non-volatile memory cell according to the prior art.
Figure 1B:
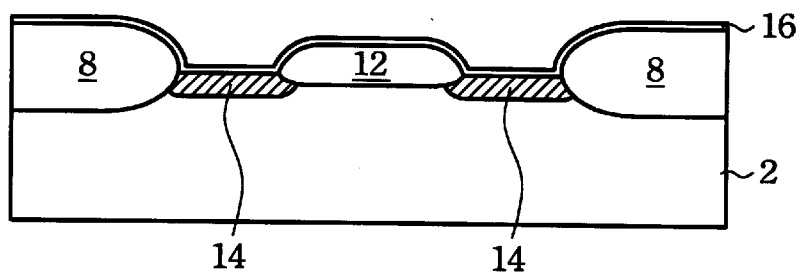
Figure 1C:
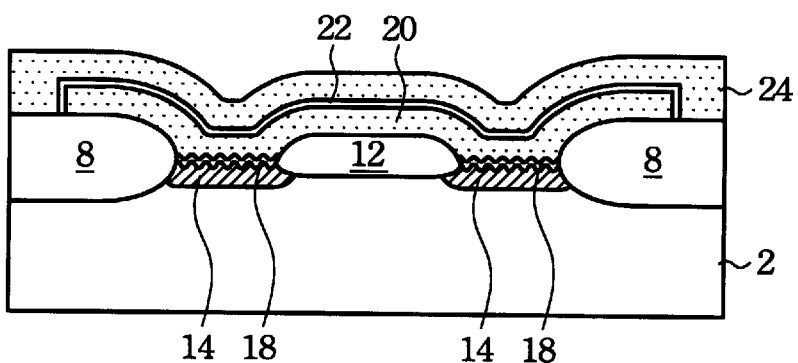
Figure 2A:
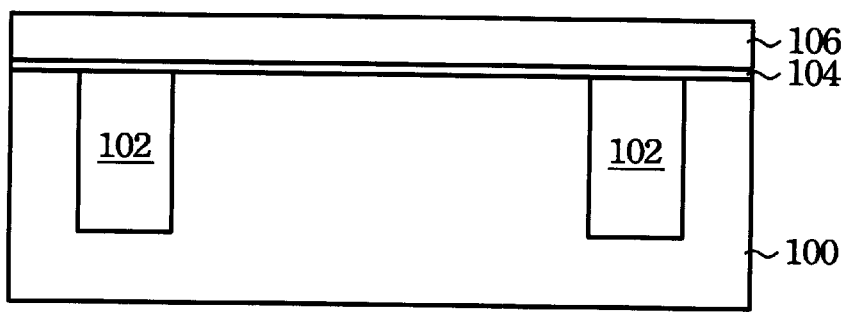
FIG. 2A to FIG. 2I schematically illustrate the cross-sectional diagram of the method of forming a tunnel oxide layer of a non-volatile memory cell according to the present invention.

Referring first to FIG. 2A, a semiconductor substrate 100 comprised of P-type single crystalline silicon is provided. Shallow trench isolation regions (STI) 102 are next formed in the semiconductor substrate 100, and the active region is also defined. After that, a first dielectric layer 104 and a second dielectric layer 106 are formed on the semiconductor substrate 100 in sequence.

The shallow trench isolation regions 102 are formed by first forming shallow trenches in the semiconductor substrate 100 using the conventional photolithographic and anisotropic reactive ion etching (RIE) procedures. After removal of the photoresist shape used to define the shallow trenches, a silicon oxide layer is deposited by low-pressure chemical vapor deposition (LPCVD) or plasma enhanced chemical vapor deposition (PECVD) procedures for completely filling the shallow trenches. A chemical mechanical polishing (CMP) process is then performed to remove silicon oxide from the top surface of the semiconductor substrate 100. The first dielectric layer 104 is formed by conventional deposition process such as PECVD or LPCVD to a thickness between 50 to 500 Angstroms. The first dielectric layer 104, which serves as a pad layer, is composed of silicon dioxide ($SiO_2$), $TiO_2$, $Ta_2O_5$ and the like. The second dielectric layer 106 is composed of silicon nitride or silicon oxynitride, and deposited by a low-pressure CVD (LPCVD) process or a plasma-enhanced CVD (PECVD) process to a thickness between 500 to 3000 Angstroms. The first dielectric layer 104 and the second dielectric layer 106 should have selective etchability.

Figure 2B:
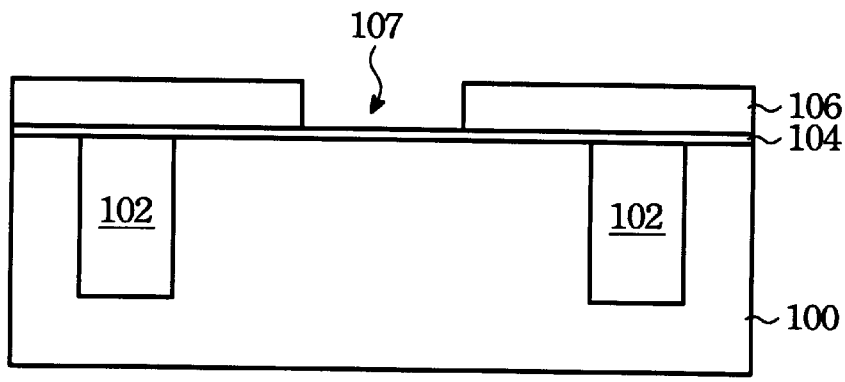

As shown in FIG. 2B, an opening 107 is formed in the second dielectric layer 106 by performing the conventional lithography and anisotropic etching techniques. The opening 107 is used for defining a non-tunnel oxide region.

Figure 2C:
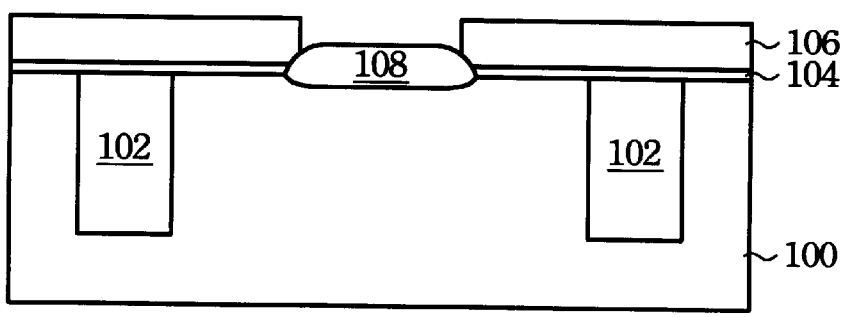

Referring now to FIG. 2C, a thermal oxidation process is performed to oxidize the semiconductor substrate 100 and form a non-tunnel oxide 108 within the opening 107. The thermal oxidation process is performed at a temperature between 850 to 1100° C. to a thickness between 2000 to 5000 Angstroms. The non-tunnel oxide 108 is used for enhancing the capacitive-coupling ratio of the non-volatile memory cell.

Figure 2D:
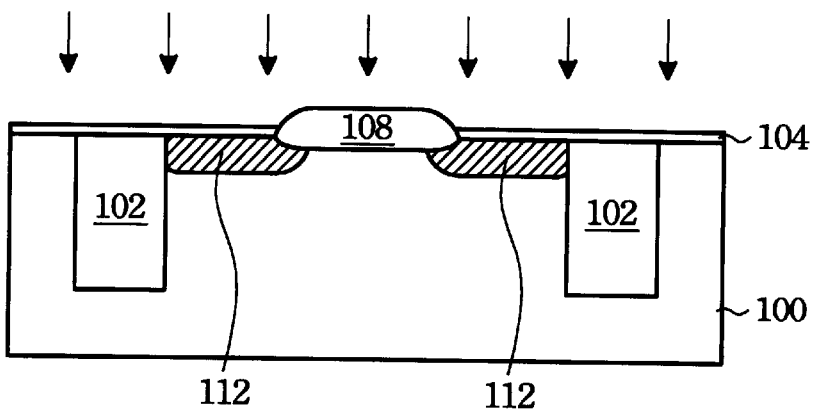

Next, please refer to FIG. 2D. After removing the second dielectric layer 106, source/drain regions 112 are formed by performing an ion implantation process and an annealing process. The ion implantation process is performed to implant appropriate impurity ions through the first dielectric layer 104 to the semiconductor substrate 100, and the annealing process is performed to drive the impurity ions further deeper to form the source/drain regions 112. Thereafter, the first dielectric layer 104 is removed by performing a wet etching process with diluted solution of hydrofluoric acid.

The second dielectric layer 106 is removed by a wet etching process with hot phosphoric acid. The dose of the dopant ions in the source/drain regions 112 ranges from 2E14 to 1E16 ions/$cm^2$ of the appropriate dopant ions, e.g., arsenic (As) or phosphorous (P) for an illustrative N-channel MOSFET (NMOS transistor) or boron (B) for an illustrative P-channel MOSFET (PMOS transistor). The implant energy of the dopant ions ranges from approximately 15 to 25 keV. The annealing process is performed by a RTA (rapid thermal annealing) process at a temperature between 850 to 1150° C.

Figure 2E:
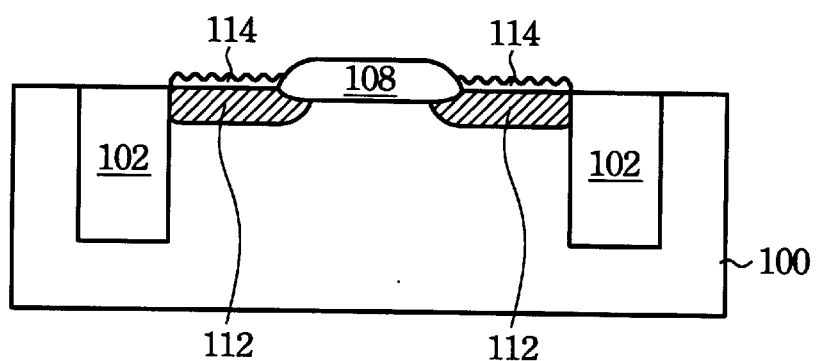

As shown in FIG. 2E, an HSG layer 114 with a plurality of HSG grains is deposited on the semiconductor substrate 100 by the traditional LPCVD process. Next, a photolithography process and an anisotropic etching process are performed to pattern the HSG layer 114, so that only the portion of the HSG layer 114 above the source/drain regions 112 is left.

Figure 2F:
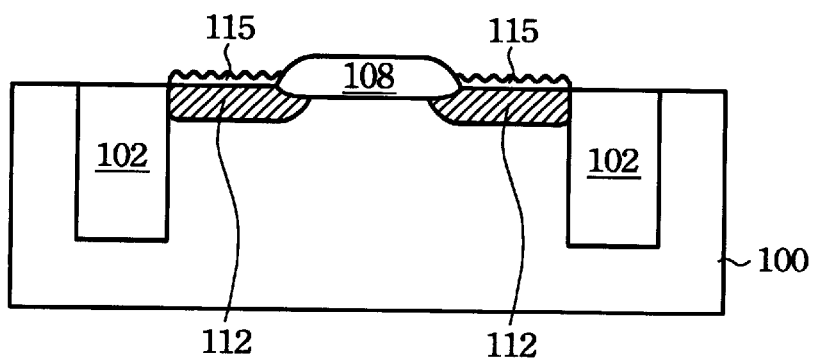
Figure 3A:
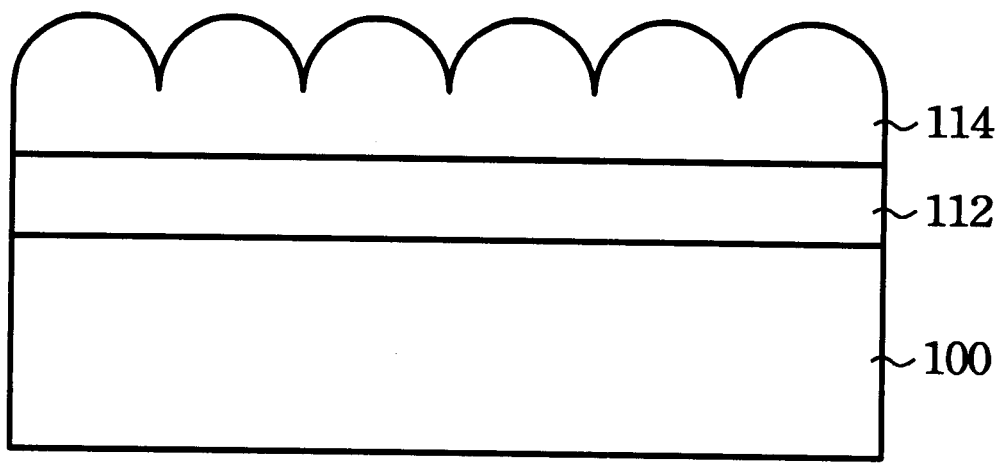
FIG. 3A schematically illustrates the magnified cross-sectional diagram of the tunnel oxide layer according to the prior art.
Figure 3B:
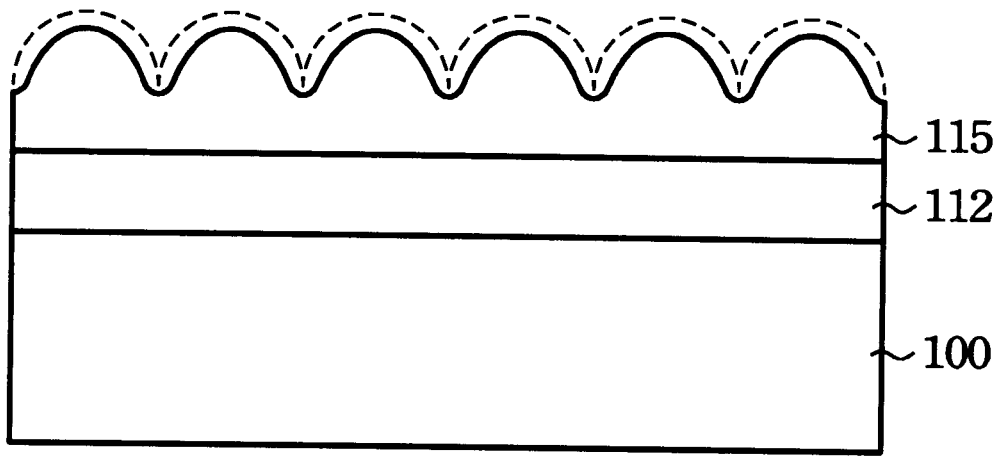
FIG. 3B schematically illustrates the magnified cross-sectional diagram of the tunnel oxide layer according to the present invention.

Referring now to FIG. 2F, HF vapor is introduced to partially etch the HSG layer 114 to enlarge the spacing between the HSG grains. This step provides an etched HSG layer 115 which has more conformal topography. Please also refer to FIG. 3A and 3B. FIG. 3A schematically illustrates the magnified cross-sectional diagram of the original HSG layer 114, and FIG. 3B schematically illustrates the magnified cross-sectional diagram of the etched HSG layer 115 and shows that the etched HSG layer 115 has more conformal topography. In addition to HF vapor, a plasma etching process by fluorine-based gas plasma such as $SF_6$, $CF_4$, and $NF_3$ can achieve the same purpose.

Next, a thermal oxidation process is performed in a dry-oxygen ambience at a temperature between 800 to 1100° C. to oxidize the etched HSG layer 115. As a result, a more conformal tunnel oxide layer (not shown in the figure) with uniform thickness is formed on the etched HSG layer 115. For this reason, the electron-injection efficiency and charge-to-breakdown of the tunnel oxide layer are more stable and can be well-controlled. Therefore, the non-volatile memory cell according to the present invention is more reliable by means of the conformal tunnel oxide layer.

Figure 2G:
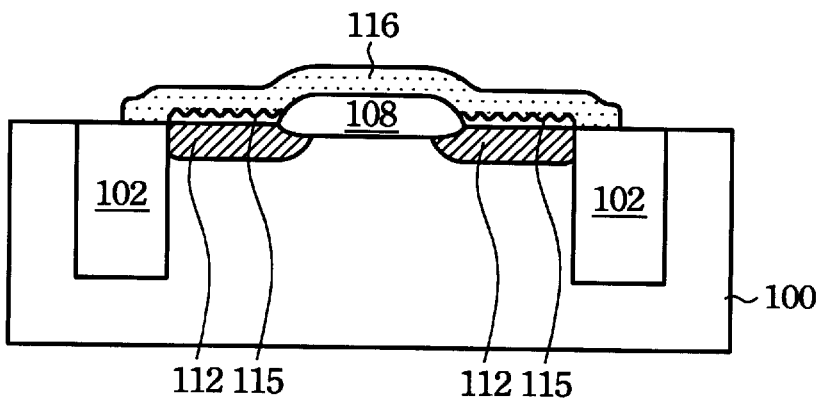

Next, referring to FIG. 2G, the floating gate 116 of the non-volatile memory cell is formed on the active region and a portion of the STIs 112. During the processes for forming the floating gate 116, a doped polysilicon layer is first deposited by a conventional deposition process such as PECVD or LPCVD. Thereafter, a photolithography process and an anisotropic RIE process are performed to pattern the doped polysilicon layer and form the floating gate 116. The polysilicon can be doped in-situ during deposition via the addition of boron, arsine, or phosphine to a silane ambient. On the other hand, the electric conductive layer can be first deposited intrinsically, and then doped via an ion implantation process.

Figure 2H:
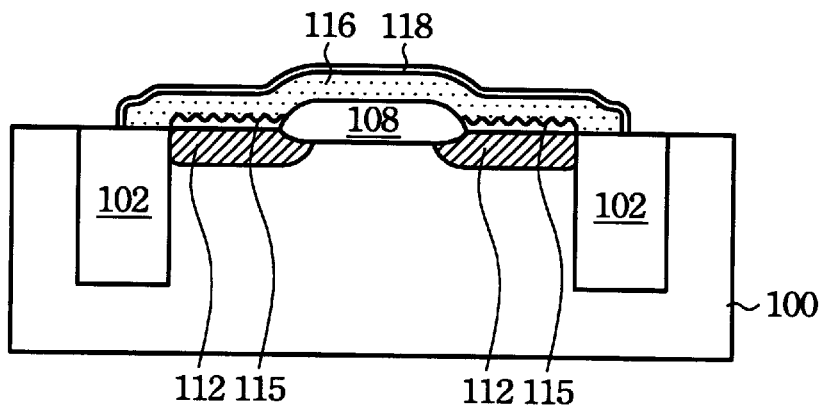

Referring now to FIG. 2H, an interpoly dielectric layer 118 of the non-volatile memory cell is formed on the surface of the floating gate 116. The interpoly dielectric layer 118 is a layer with high dielectric constant, such as silicon nitride film, $Ta_2O_5$ film, oxide/nitride composition film, or oxide/nitride/oxide composition film (ONO).

Figure 2I:
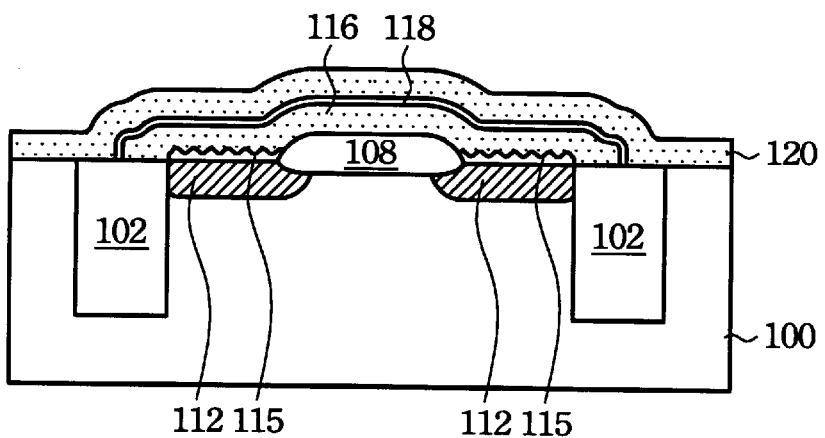

Next, referring to FIG. 2I, a control gate 120 of the non-volatile memory cell is formed on the interpoly dielectric layer 118. During the processes for forming the control gate 120, a doped polysilicon layer is first deposited by a conventional deposition process such as PECVD or LPCVD. Thereafter, a photolithography process and an anisotropic RIE process are performed to pattern the doped polysilicon layer and form the control gate 120. The polysilicon can be doped in-situ during deposition via the addition of boron, arsine, or phosphine to a silane ambient. On the other hand, the electric conductive layer can be first deposited intrinsically, and then doped via an ion implantation process.

The key feature of the present invention is that the tunnel oxide layer is conformal and having uniform thickness. For this reason, the electron-injection efficiency and charge-to-breakdown of the tunnel oxide layer are more stable and can be well-controlled. The non-volatile memory cell according to the present invention is more reliable by means of the conformal tunnel oxide layer.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A method of forming a tunnel oxide layer of a non-volatile memory cell, said method comprising:

a. forming a first dielectric layer and a second dielectric layer on a semiconductor substrate;

b. patterning said second dielectric layer to form an opening;

c. oxidizing said semiconductor substrate to form a non-tunnel oxide within said opening;

d. removing said second dielectric layer;

e. forming source/drain regions;

f. removing said first dielectric layer;

g. forming and patterning an HSG layer with a plurality of HSG grains on said source/drain regions;

h. partially etching said HSG layer to enlarge a spacing between said HSG grains; and i. oxidizing said HSG layer to form said tunnel oxide layer.

2. The method of claim 1, after oxidizing said HSG layer further comprising;

a. forming a floating gate of said non-volatile memory cell on said tunnel oxide layer;

b. forming an interpoly dielectric of said non-volatile memory cell on said floating gate; and c. forming a control gate of said non-volatile memory cell on said interpoly dielectric.

3. The method of claim 2, wherein said floating gate of said non-volatile memory cell is formed by first depositing a doped polysilicon layer on said tunnel oxide layer, and then performing a photolithography process and an anisotropic RIE process to pattern said doped polysilicon layer.

4. The method of claim 2, wherein said control gate of said non-volatile memory cell is formed by first depositing a doped polysilicon layer on said interpoly dielectric, and then performing a photolithography process and an anisotropic RIE process to pattern said doped polysilicon layer.

5. The method of claim 1, wherein said first dielectric layer is a silicon oxide layer.

6. The method of claim 1, wherein said second dielectric layer is a silicon nitride layer.

7. The method of claim 1, wherein said second dielectric layer is removed by a wet etching process with hot phosphoric acid.

8. The method of claim 1, wherein said source/drain regions are formed by performing an ion implantation process and an annealing process.

9. The method of claim 1, wherein said first dielectric layer is removed by performing a wet etching process with diluted solution of hydrofluoric acid.

10. The method of claim 1, wherein said HSG layer is partially etched by HF vapor.

11. The method of claim 1, wherein said HSG layer is partially etched by performing a plasma etching process.

12. The method of claim 11, wherein said plasma etching process is performed by fluorine-based gas plasma.

13. The method of claim 12, wherein said fluorine-based gas plasma is $SF_6$.

14. The method of claim 12, wherein said fluorine-based gas plasma is $CF_4$.

15. The method of claim 12, wherein said fluorine-based gas plasma is $NF_3$.

16. A method of forming a conformal tunnel oxide layer of a non-volatile memory cell, said method comprising:

a. forming a first dielectric layer and a second dielectric layer on a semiconductor substrate;

b. patterning said second dielectric layer to form an opening;

c. oxidizing said semiconductor substrate to form a non-tunnel oxide within said opening;

d. removing said second dielectric layer by a wet etching process with hot phosphoric acid;

e. forming source/drain regions by performing an ion implantation process and an annealing process;

f. removing said first dielectric layer;

g. forming and patterning an HSG layer with a plurality of HSG grains on said source/drain regions;

h. partially etching said HSG layer by HF vapor to enlarge a spacing between said HSG grains;

i. oxidizing said HSG layer to form said conformal tunnel oxide layer;

j. forming a floating gate of said non-volatile memory cell on said tunnel oxide layer;

k. forming an interpoly dielectric of said non-volatile memory cell on said floating gate; and l. forming a control gate of said non-volatile memory cell on said interpoly dielectric.

17. A method of forming a conformal tunnel oxide layer of a non-volatile memory cell, said method comprising:

a. forming a first dielectric layer and a second dielectric layer on a semiconductor substrate;

b. patterning said second dielectric layer to form an opening;

c. oxidizing said semiconductor substrate to form a non-tunnel oxide within said opening;

d. removing said second dielectric layer by a wet etching process with hot phosphoric acid;

e. forming source/drain regions by performing an ion implantation process and an annealing process;

f. removing said first dielectric layer;

g. forming and patterning an HSG layer with a plurality of HSG grains on said source/drain regions;

h. partially etching said HSG layer by performing a plasma etching process to enlarge a spacing between said HSG grains;

i. oxidizing said HSG layer to form said conformal tunnel oxide layer;

j. forming a floating gate of said non-volatile memory cell on said tunnel oxide layer;

k. forming an interpoly dielectric of said non-volatile memory cell on said floating gate; and l. forming a control gate of said non-volatile memory cell on said interpoly dielectric.

18. The method of claim 17, wherein said plasma etching process is performed by $SF_6$.

19. The method of claim 17, wherein said plasma etching process is performed by $CF_4$.

20. The method of claim 17, wherein said plasma etching process is performed by $NF_3$.

* * * * *

UNITED STATES PATENT AND TRADEMARK OFFICE
CERTIFICATE OF CORRECTION

PATENT NO.    : 6,395,603 B1
DATED         : May 28, 2002
INVENTOR(S)   : Tseng

It is certified that error appears in the above-identified patent and that said Letters Patent is hereby corrected as shown below:

<u>Title page,</u>
Item [56], U.S. PATENT DOCUMENTS, reference 6,222,722, please delete date issue date "9/2001" and insert -- 4/2001 --.

Signed and Sealed this

Nineteenth Day of November, 2002

*Attest:*

*Attesting Officer*

JAMES E. ROGAN
*Director of the United States Patent and Trademark Office*